United States Patent
Sun et al.

(10) Patent No.: US 11,784,032 B2
(45) Date of Patent: Oct. 10, 2023

(54) TILTED MAGNETRON IN A PVD SPUTTERING DEPOSITION CHAMBER

(71) Applicant: Applied Materials, Inc., Santa Clara, CA (US)

(72) Inventors: Lizhong Sun, San Jose, CA (US); Xiaodong Yang, Xi'an (CN); Yufei Zhou, Wuxi (CN); Yi Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/285,074

(22) PCT Filed: Nov. 14, 2018

(86) PCT No.: PCT/CN2018/115365
§ 371 (c)(1),
(2) Date: Apr. 13, 2021

(87) PCT Pub. No.: WO2020/097815
PCT Pub. Date: May 22, 2020

(65) Prior Publication Data
US 2021/0351024 A1    Nov. 11, 2021

(51) Int. Cl.
*H01J 37/34*    (2006.01)
*C23C 14/35*    (2006.01)

(52) U.S. Cl.
CPC ......... *H01J 37/3455* (2013.01); *C23C 14/35* (2013.01); *H01J 37/3408* (2013.01); *H01J 2237/332* (2013.01)

(58) Field of Classification Search
None
See application file for complete search history.

(56) References Cited

U.S. PATENT DOCUMENTS

| 2004/0163951 A1* | 8/2004 | Iseki | H01J 37/3408 204/298.19 |
|---|---|---|---|
| 2004/0173455 A1 | 9/2004 | Wang | |

(Continued)

FOREIGN PATENT DOCUMENTS

| CN | 1524283 A | 8/2004 |
|---|---|---|
| CN | 1525519 A | 9/2004 |

(Continued)

OTHER PUBLICATIONS

International Search Report and Written Opinion dated Aug. 20, 2019, Application No. PCT/CN2018/115365.

(Continued)

*Primary Examiner* — Jason Berman
(74) *Attorney, Agent, or Firm* — Patterson + Sheridan, LLP

(57) ABSTRACT

A chamber includes a target (16) and a magnetron (50) disposed over the target (16). The magnetron (50) includes a plurality of magnets (52, 54). The magnetron (50) has a longitudinal dimension and a lateral dimension. The longitudinal dimension of the magnetron (50) is tilted with respect to the target (16) so the distances between magnets (52, 54) and the target (16) vary. As the magnetron (50) rotates during operation, the strength of the magnetic field produced by the magnetron (50) is an average of the various strengths of magnetic fields produced by the magnets (52, 54). The averaging of the strengths of the magnetic fields leads to uniform film properties and uniform target erosion.

16 Claims, 4 Drawing Sheets

(56) References Cited

U.S. PATENT DOCUMENTS

| | | | | |
|---|---|---|---|---|
| 2005/0133365 A1* | 6/2005 | Hong | ................ | C23C 14/35 |
| | | | | 204/298.03 |
| 2005/0274610 A1 | 12/2005 | Iseki | | |
| 2007/0108041 A1* | 5/2007 | Guo | ................ | H01J 37/3408 |
| | | | | 204/192.1 |
| 2020/0105511 A1* | 4/2020 | Wang | ................ | H01J 37/3455 |

FOREIGN PATENT DOCUMENTS

| | | | |
|---|---|---|---|
| CN | 1603456 | A | 4/2005 |
| CN | 1693531 | A | 11/2005 |
| CN | 101503793 | A | 8/2009 |
| CN | 101709455 | A | 5/2010 |
| CN | 103109344 | A | 5/2013 |
| CN | 108456859 | A | 8/2018 |
| JP | H07166346 | A | 5/1995 |
| JP | 2000303172 | A | 10/2000 |
| JP | 2004143594 | A | 5/2004 |
| JP | 2005336520 | A | 12/2005 |
| JP | 2006002244 | A | 1/2006 |

OTHER PUBLICATIONS

Chinese Office Action dated Sep. 21, 2022 for Application No. 201880099083.0.
European Search Report issued to Application No. 18939821.7 dated May 4, 2022.
Office Action for Chinese Application No. 201880099083.0 dated Apr. 15, 2023.
Office Action for Korean Application No. 10-2021-7017870 dated Jun. 1, 2023.
Chinese Office Action for Application No. 201880099083.0 dated Aug. 10, 2023.

* cited by examiner

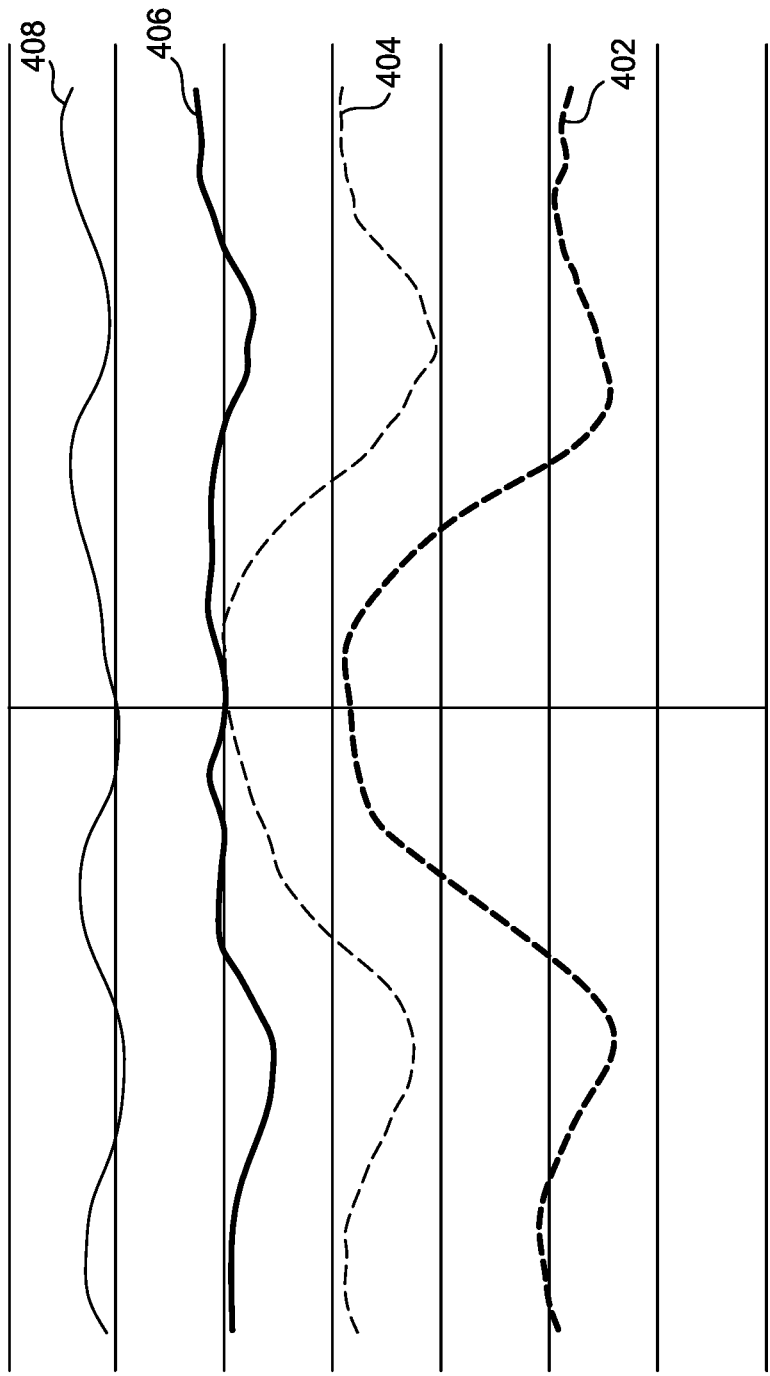

TILTED MAGNETRON IN A PVD SPUTTERING DEPOSITION CHAMBER

BACKGROUND

Field

Embodiments of the disclosure relate to a physical vapor deposition (PVD) chamber. More specifically, some embodiments of the disclosure relate to a tilted magnetron in a PVD chamber.

Description of the Related Art

In semiconductor processing, PVD is a conventionally used process for depositing a thin film. A PVD process generally includes bombarding a target including a source material with ions generated in a plasma, causing the source material to be sputtered from the target. Typically, the ejected source material is then accelerated towards a substrate being processed via a voltage bias, resulting in a deposition of the source material on a surface of the substrate with or without the sputtered source material reacting with another reactant.

In PVD processes, magnetrons are typically placed above the target in the PVD chamber. A planar magnetron system typically uses a rotating magnetron disposed above a target and either a DC bias between the target and the substrate and/or an RF source coupled into the space between the target and substrate to form the plasma. The magnetron is a magnet assembly that provides magnetic field lines near the sputtering surface of the target. A negative bias voltage between the target and the plasma region accelerates the ions toward the target to dislodge the target material therefrom. The magnetic field from the magnetron confines the free electrons, including secondary electrons displaced from the target material, near the target to maximize the ionizing collisions by the free electrons with the sputtered material. The magnetron typically includes one or more magnets, which are assembled on a metal plate positioned in parallel to the target and rotate around the backside, i.e., non-sputtered surface, of the target to spread the magnetic field around the surface of the target.

Thickness and stress uniformity are key parameters for producing quality films. In conventional PVD chambers, magnetrons create magnetic fields that vary in magnitude and vary spatially. Large variations in magnetic fields make it difficult to maintain uniform magnetic fields that allow for uniform target erosion and film properties. A non-uniform magnetic field leads to high stress and thickness non-uniformities in the films deposited by PVD. Additionally, a non-uniform magnetic field, which leads to non-uniform erosion of the target, reduces the lifetime of the target.

Accordingly, there is a need for an improved PVD chamber.

SUMMARY

Embodiments of the disclosure relate to a physical vapor deposition (PVD) chamber. More specifically, embodiments of the disclosure relate to a tilted magnetron in a PVD chamber. In one embodiment, a process chamber includes a chamber body, a substrate support disposed in the chamber body, a sputtering target disposed in the chamber body, the sputtering target having a surface facing the substrate support, and a magnetron disposed over the sputtering target. The magnetron includes magnets having ends facing the sputtering target that define a plane that is tilted at an acute angle with respect to the surface of the sputtering target.

In another embodiment, a process chamber includes a chamber body, a substrate support disposed in the chamber body, a sputtering target disposed in the chamber body, the sputtering target having a surface facing the substrate support, and a magnetron disposed over the sputtering target. The magnetron includes a backing plate having a longitudinal dimension that is tilted at a first acute angle with respect to the surface of the sputtering target.

In another embodiment, a process chamber for use with a sputtering target. The process chamber includes a chamber body, a substrate support disposed in the chamber body, and a magnetron disposed over the sputtering target when the sputtering target is installed in the process chamber over the substrate support. The magnetron includes magnets having ends facing the sputtering target that define a plane that is tilted at an acute angle with respect to a surface of the sputtering target facing the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a chart illustrating the effect of tilted magnetron on film stress.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure generally relate to a tilted magnetron in a PVD chamber. In one embodiment, The PVD chamber includes a target and a magnetron disposed over the target. The magnetron includes a plurality of magnets. The magnetron has a longitudinal dimension and a lateral dimension. The longitudinal dimension of the magnetron is tilted with respect to the target so the distances between magnets and the target vary. The strength of the magnetic field produced by each magnetic is different. As the magnetron rotates during operation, the strength of the magnetic field produced by the magnetron is an average of the various strengths of magnetic fields produced by the magnets. The averaging of the strengths of the magnetic fields leads to uniform film properties and uniform target erosion.

Figure 1:
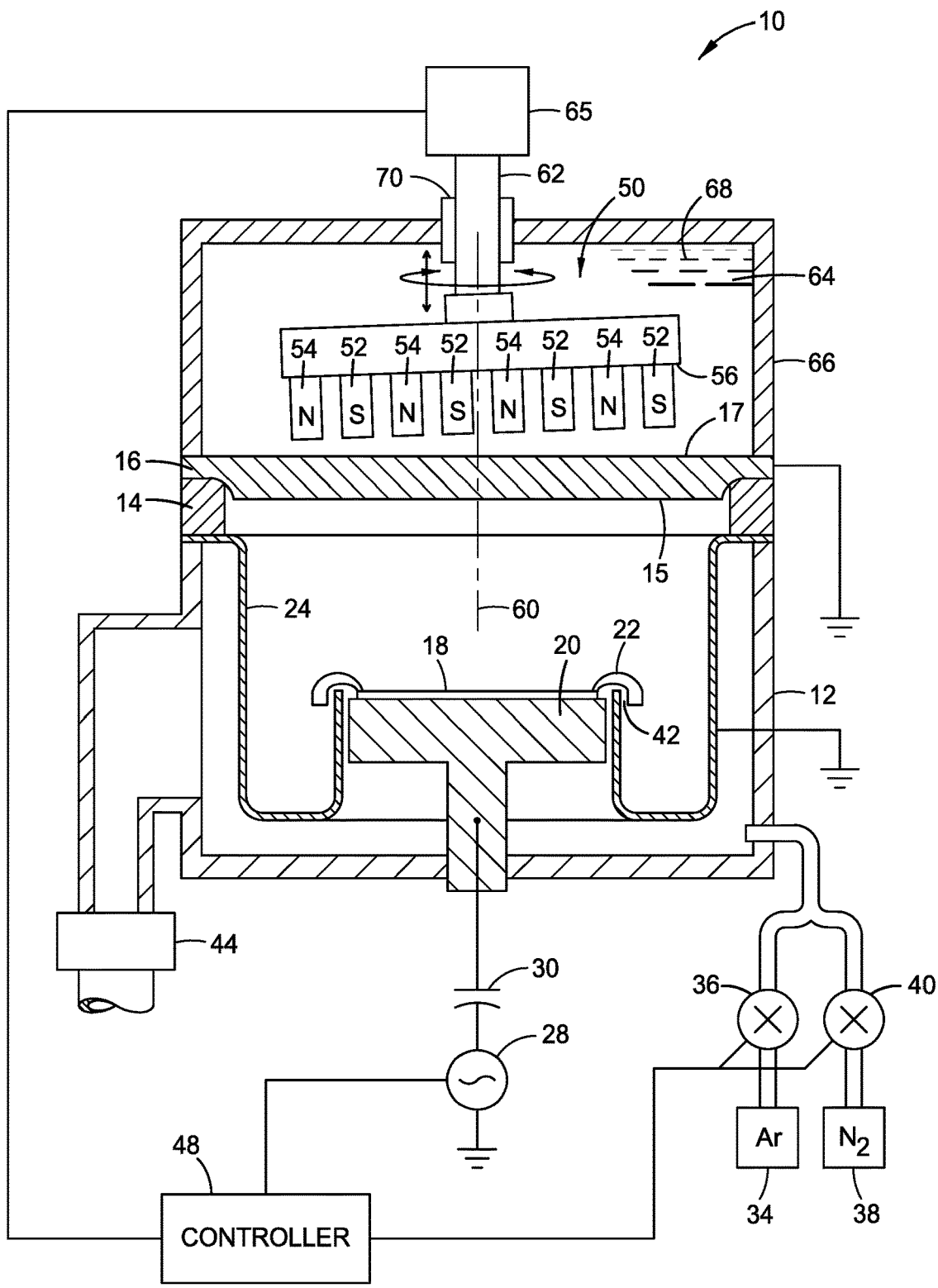
FIG. 1 is a simplified cross sectional side view of a PVD chamber.

FIG. 1 is a simplified cross sectional view of a PVD chamber 10 according to one embodiment. The chamber 10 includes a vacuum chamber body 12 sealed through a ceramic insulator 14 to a sputtering target 16. The target 16 has at least a first surface 15 facing a substrate 18 and a second surface 17 opposite the first surface 15. The first surface 15 of the target 16 is composed of a material, usually a metal, to be sputter deposited onto a surface of the substrate 18 disposed on a substrate support 20 disposed in the chamber body 12. The target 16 has a central axis 60 that passes perpendicularly through at least one of the first and second surfaces 15, 17 of the target 16. The central axis 60 also passes perpendicularly through an upper substrate support surface of the substrate support 20. As such, the central axis 60 of the target 16 is co-linear with a central axis of the substrate support 20. The substrate 18 may be secured by a substrate clamp 22. Alternatively to the substrate clamp 22, a cover ring or an electrostatic chuck may be incorporated into the substrate support 20 for securing the substrate 18. The target material may be aluminum, copper, titanium, tantalum, cobalt, nickel, molybdenum, alloys of these metals containing up to 45 percent by atomic percent (at %) of an alloying element, or other metals and metal alloys amenable to DC sputtering. On the other hand, RF sputtering may be used to sputter material from a dielectric target.

A grounded shield 24 is disposed within the chamber body 12 for protecting the chamber body 12 from the sputtered material. The shield 24 also provides a grounded anode. An RF power supply 28 may be coupled to an electrode (not shown) embedded in the substrate support 20 through an AC capacitive coupling circuit 30 to allow the substrate support 20 to develop a DC self-bias voltage in the presence of a plasma. A negative DC self-bias attracts positively charged sputter ions created in a high-density plasma deeply into a high aspect-ratio holes characteristic of advanced integrated circuits.

A first gas source 34 supplies a sputtering working gas, such as argon, to the chamber body 12 through a mass flow controller 36. In reactive metallic nitride sputtering, for example, of titanium nitride or tantalum nitride, nitrogen is additionally supplied into the chamber body 12 from another gas source 38 through another mass flow controller 40. Oxygen can alternatively be supplied to produce oxides such as $Al_2O_3$. The gases can be introduced from various positions within the chamber body 12. For example, one or more inlet pipes located near the bottom of the chamber body 12 supply gas at the back of the shield 24. The gas penetrates through an aperture at the bottom of the shield 24 or through a gap 42 formed between the substrate clamp 22 and the shield 24. A vacuum pumping system 44 connected to the chamber body 12 through a wide pumping port maintains the interior of the chamber body 12 at a low pressure. A computer based controller 48 controls components of the chamber 10 including the RF power supply 28 and the mass flow controllers 36, 40.

To provide efficient sputtering, a magnetron 50 is disposed above the target 16. The magnetron 50 may be disposed in a magnetron cavity 64 defined by a coolant chamber 66 positioned above the target 16. The magnetron 50 includes a plurality of magnets 52, 54 to produce a magnetic field within the chamber body 12. The plurality of magnets 52, 54 may be coupled by a backing plate 56. Each magnet 52 may be arranged so one pole is facing the target 16, and each magnets 54 may be arranged so the other pole is facing the target 16. For example, as shown in FIG. 1, each magnet 52 is arranged so the south pole is facing the target 16, and each magnet 54 is arranged so the north pole is facing the target 16. The magnets 52 and magnets 54 may be alternately arranged along a longitudinal dimension (in the X-axis direction) of the magnetron 50, as shown in FIG. 1. In some embodiments, a pair of adjacent magnets 52, 54 may be replaced with a single U shaped magnet, and the magnetron 50 includes a plurality of U shaped magnets. In one embodiment, the magnetron 50 is rotated about the central axis 60 of the target 16, so the central axis 60 is also the axis of rotation of the magnetron 50. The magnetron 50 is coupled to a shaft 62 driven by a motor 65. The motor 65 may be also capable of moving the magnetron 50 along the Z-axis. In one embodiment, as shown in FIG. 1, the magnetron 50 is positioned so the central axis 60 is the axis of symmetry of the longitudinal dimension of the magnetron 50.

The magnetron 50 is tilted with respect to the target 16. In other words, the magnetron 50 forms an acute angle with respect to the central axis 60 or the axis of rotation of the magnetron 50. The tilting of the magnetron 50 may be controlled by the controller 48 via the motor 65. The degree of the tilting of the magnetron 50 may be adjusted between batches, between substrates, or in-situ during the processing of a single substrate. The degree of the tilting of the magnetron 50 may be controlled based on film thickness or stress data feedback. The specific component of the magnetron 50 that is tilted with respect to the target 16 may vary. In one embodiment, the longitudinal dimension of the backing plate 56 is tilted with respect to the target 16. In one embodiment, a plane defined by ends of magnets 52, 54 facing the target 16 is tilted with respect to the target 16. In one embodiment, the magnetron 50 is tilted with respect to the first surface 15 of the target 16. In another embodiment, the magnetron is tilted with respect to the second surface 17. In some embodiments, the magnetron 50 and the target 16 form an acute angle ranging from about 0.3 degrees to about 5 degrees, such as from about 1 degree to about 2 degrees. In some embodiments, the magnetron 50 and the central axis 60 form an acute angle ranging from about 85 degrees to about 89.7 degrees, such as from about 88 degrees to about 89 degrees. If the degree of the tilting of the magnetron 50 with respect to the target 16 is too small, such as less than 0.3 degrees, the effect of the averaging of the magnetic fields strengths is diminished. On the other hand, if the degree of the tilting of the magnetron 50 with respect to the target 16 is very large, such as greater than about 5 degrees, the dimensions of the magnetron 50 and the magnetron cavity 64 may be difficult to effectively fabricate. As the magnetron 50 rotates during operation, the strength of the magnetic field produced by the magnetron 50 is an average of the various strengths of magnetic fields produced by the magnets 52, 54. The averaging of the strengths of the magnetic fields leads to uniform film properties and uniform target erosion.

In some embodiments, one or more magnets 52, 54 may be positioned at the axis of rotation of the magnetron 50, and the distance between the one or more magnets 52, 54 positioned at the axis of rotation and the target 16 does not change as the magnetron 50 is rotating during operation. In order to further averaging the strengths of the magnetic fields, the magnetron 50 may be moved along the axis of rotation (Z-axis) continuously or stepwise while rotating during operation. In one embodiment, the magnetron 50 is at a first position at the beginning of a PVD process to form a layer, and the magnetron 50 is moving continuously along the Z-axis while the magnetron 50 is rotating during the formation of the layer and until the layer is formed. In one embodiment, the continuous movement of the magnetron 50 along the Z-axis is in one direction, for example, up towards the motor 65 or down towards the target 16. In one embodiment, the continuous movement of the magnetron 50 along the Z-axis is first in one direction and then in an opposite direction, for example, first up towards the motor 65 and then down towards the target 16. The movement of the magnetron 50 during operation may be stepwise or discretely. For example, the magnetron maintains a first position along the Z-axis for a first period of time during the formation of a layer, move to a second position along the Z-axis, and maintains at the second position along the Z-axis for a second period of time during the formation of the layer. The second position along the Z-axis may be above or below the first position along the Z-axis. The magnetron 50 may be maintained at multiple positions along the Z-axis during the formation of a layer.

To counteract the large amount of power delivered to the target 16, the back of the target 16 may be sealed to the coolant chamber 66, which encloses the magnetron cavity 64. The coolant chamber 66 may include a coolant 68, such as chilled deionized water, to cool the target 16 and/or magnetron 50. The magnetron 50 is immersed in the coolant 68, and the target rotation shaft 62 passes through the coolant chamber 66 through a rotary seal 70.

Figure 2:
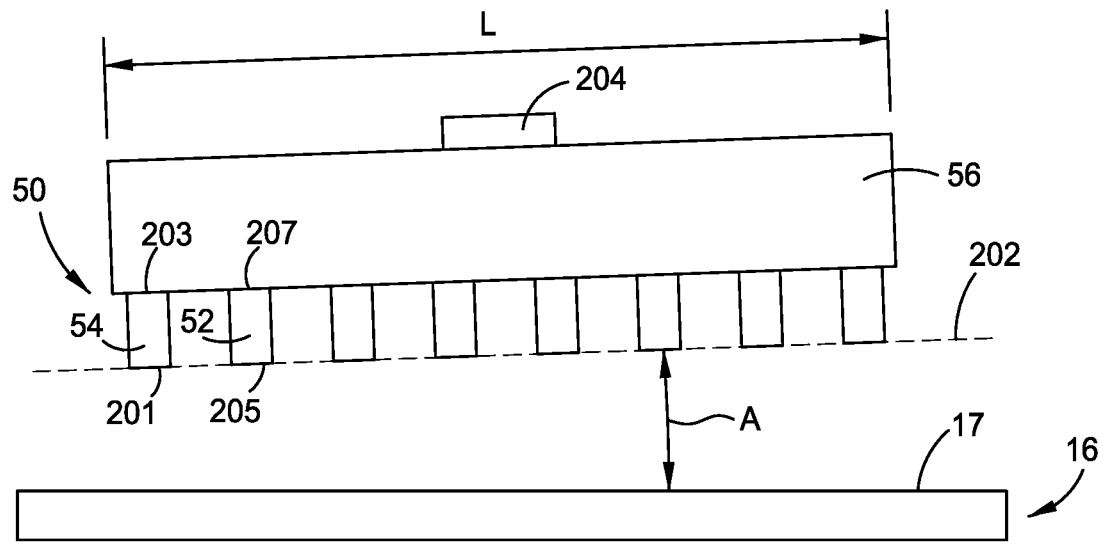
FIG. 2 is a cross sectional side view of a magnetron and a target.

FIG. 2 is a cross sectional side view of the magnetron 50 and the target 16. As shown in FIG. 2, the magnetron 50 includes the backing plate 56 and the plurality of magnets 52, 54 coupled to the backing plate 56. Each magnet 54 has a first end 201 facing the second surface 17 of the target 16 and a second end 203 coupled to the backing plate 56. Each magnet 52 has a first end 205 facing the second surface 17 of the target 16 and a second end 207 coupled to the backing plate 56. In one embodiment, the first ends 201, 205 of the magnets 52, 54 are substantially coplanar and define a plane 202. The plane 202 forms an angle A with respect to the target 16. The angle A may range from about 1 degree to about 20 degrees, such as from about 2 degrees to about 10 degrees. In some embodiments, the plane 202 and the central axis 60 (or the axis of rotation of the magnetron 50) (shown in FIG. 1) form an acute angle ranging from about 70 degrees to about 89 degrees, such as from about 80 degrees to about 88 degrees. In another embodiment, a longitudinal dimension L of the backing plate 56 forms the angle A with respect to the target 16. In some embodiments, the longitudinal dimension L of the backing plate 56 and the central axis 60 (or the axis of rotation of the magnetron 50) (shown in FIG. 1) form an acute angle ranging from about 70 degrees to about 89 degrees, such as from about 80 degrees to about 88 degrees.

The magnetron 50 includes a connector 204 for coupling the backing plate 56 to the shaft 62 (shown in FIG. 1). The connector 204 is positioned so the backing plate 56 is substantially symmetric with respect to the connector 204 in the longitudinal dimension L.

Figure 3A:
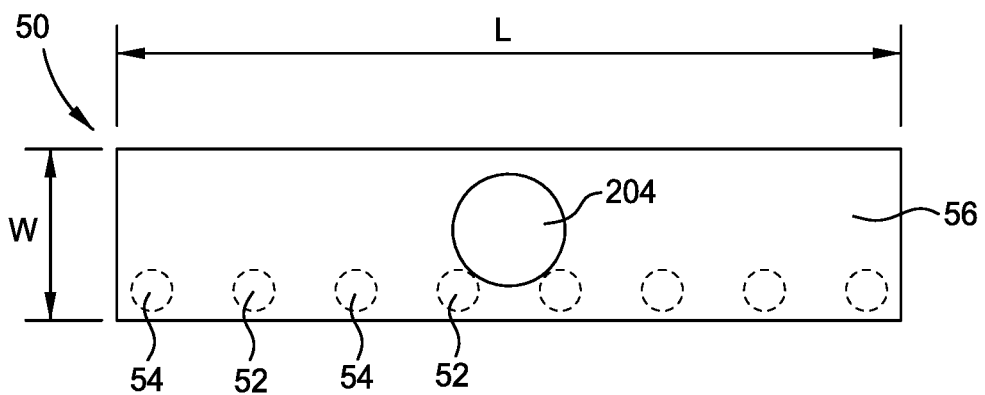
FIG. 3A is a top view of the magnetron of FIG. 2.

FIG. 3A is a top view of the magnetron 50 of FIG. 2. As shown in FIG. 3A, the magnetron 50 includes the backing plate 56 and the plurality of magnets 52, 54 coupled to the backing plate 56. The plurality of magnets 52, 54 is arranged linearly. The backing plate 56 is substantially symmetric with respect to the connector 204 in the longitudinal dimension L. The connector 204 may be located anywhere on the backing plate 56 along a lateral dimension W.

Figure 3B:
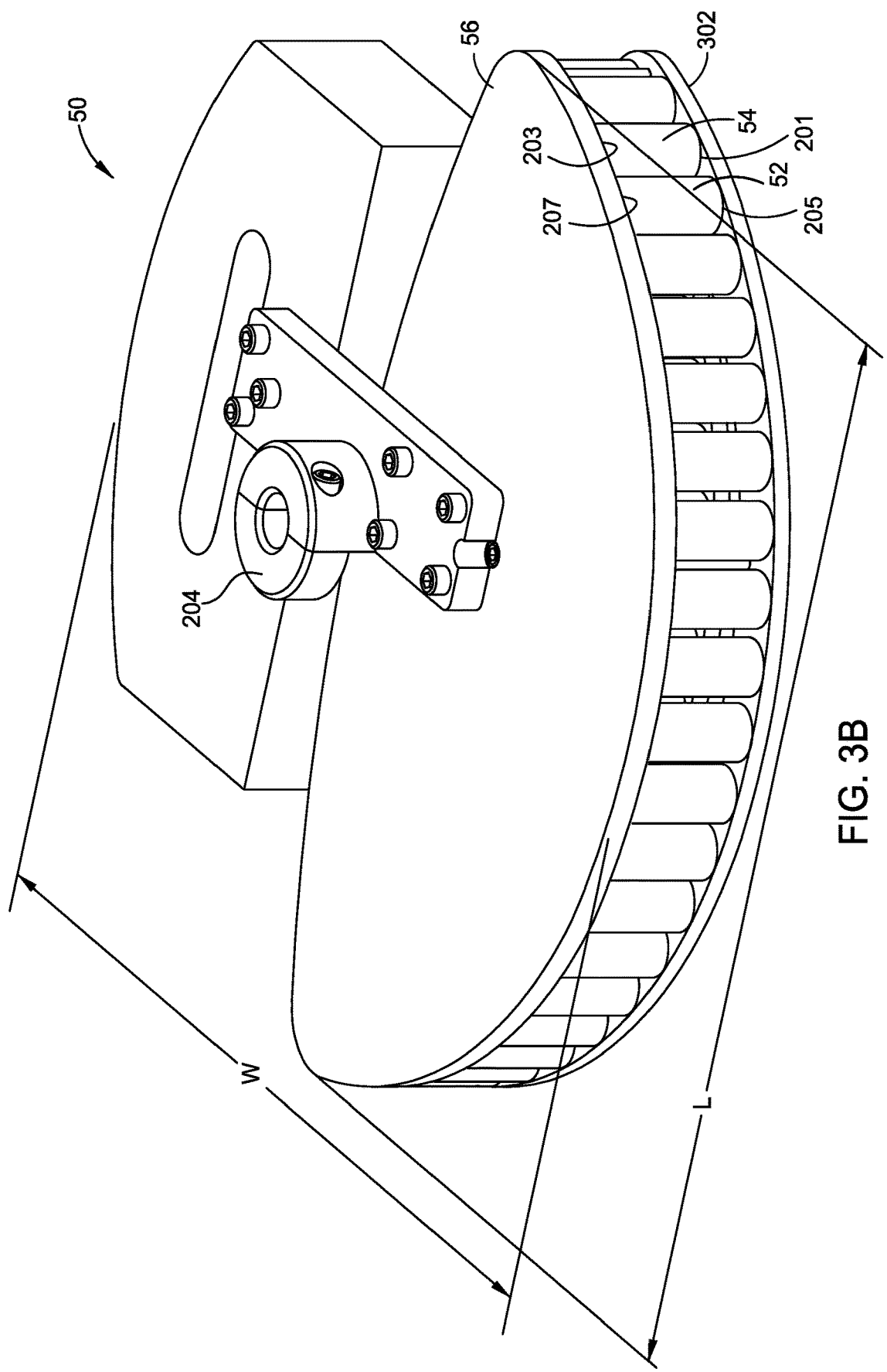
FIG. 3B is an orthographic view of the magnetron of FIG. 2.

FIG. 3B is an orthographic view of the magnetron 50 of FIG. 2. As shown in FIG. 3B, the magnetron 50 includes the backing plate 56 and the plurality of magnets 52, 54 coupled to the backing plate 56. The plurality of magnets 52, 54 is arranged non-linearly. In some embodiments, the plurality of magnets 52, 54 form concentric circles. In some embodiments, the plurality of magnets 52, 54 form non-concentric circles. The plurality of magnets 52, 54 may be arranged in other suitable shapes. In one embodiment, the magnetron 50 further includes a plate 302 coupled to the magnets 52, 54 opposite the backing plate 56, and the plate 302 forms the angle A with respect to the target 16 (shown in FIG. 2). The backing plate 56 is substantially symmetric with respect to the connector 204 in the longitudinal dimension L. The connector 204 may be located anywhere on the backing plate 56 along a lateral dimension W.

FIG. 4 is a chart illustrating the effect of tilted magnetron on film stress. The tilted magnetron may be the magnetron 50 shown in FIG. 1. Curves 402 and 404 show the film stress across the substrate of films formed by PVD using conventional magnetron. The film of the curve 402 was formed with a bias power less than that of the film of the curve 404. Curves 406 and 408 show the film stress across the substrate of films produced by PVD using the tilted magnetron that forms an angle of about 1 degree with respect to the central axis of the target. The film of the curve 406 was formed with a bias power that is the same as the bias power used to form the film of the curve 402. The film of the curve 408 was formed with a bias power that is the same as the bias power used to form the film of the curve 404. As shown in FIG. 4, the curve 406 is substantially flatter than the curve 402, and the curve 408 is substantially flatter than the curve 404. Thus, the film stress is substantially more uniform across the substrate when the film is formed using the tilted magnetron.

The tilted magnetron, such as a magnetron forming an angle from about 0.3 degree to about 5 degrees with respect to the target, averages the strengths of the magnetic fields produced by the plurality of magnets. The averaging of the strengths leads to uniform film properties and uniform target erosion.

While the foregoing is directed to embodiments of the present disclosure, other and further embodiments of the disclosure may be devised without departing from the basic scope thereof, and the scope thereof is determined by the claims that follow.

What is claim is:

1. A process chamber, comprising:
   a chamber body;
   a substrate support disposed in the chamber body;
   a sputtering target disposed in the chamber body, the sputtering target having a surface facing the substrate support; and
   a magnetron disposed over the sputtering target, the magnetron comprising:
      a shaft defining an axis of rotation and a plurality of magnets having ends facing the sputtering target that define a plane that is operable to be tilted at an adjustable angle with respect to the surface of the sputtering target, the magnetron moveable about the axis of rotation, in a direction parallel to the axis of rotation, and at an angle with respect to the surface of the sputtering target; and
      a motor coupled to the shaft configured to adjust the angle of the magnetron with respect to the surface of the sputtering target.

2. The process chamber of claim 1, wherein the magnetron further comprises a second motor coupled to the shaft configured to rotate the magnetron about the axis of rotation and move the magnetron in the direction parallel to the axis of rotation.

3. The process chamber of claim 2, wherein the magnetron further comprises a connector disposed over the backing plate, the magnetron disposed inside a magnetron cavity defined by a coolant chamber, the shaft disposed through the coolant chamber and through a rotary seal disposed coupled to a wall of the coolant chamber.

4. The process chamber of claim 2, wherein the motor is configured to move the magnetron along the axis of rotation continuously during operation.

5. The process chamber of claim 2, wherein the motor is configured to move the magnetron along the axis of rotation discretely during operation.

6. A process chamber, comprising:
a chamber body;
a substrate support disposed in the chamber body;
a sputtering target disposed in the chamber body, the sputtering target having a surface facing the substrate support; and
a magnetron disposed over the sputtering target, the magnetron comprising:
a shaft defining an axis of rotation and a backing plate having a longitudinal dimension that is operable to be tilted at an adjustable angle with respect to the surface of the sputtering target, the magnetron moveable about the axis of rotation, in a direction parallel to the axis of rotation, and at an angle with respect to the surface of the sputtering target; and
a motor coupled to the shaft configured to adjust the angle of the magnetron with respect to the surface of the sputtering target.

7. The process chamber of claim 6, wherein the adjustable angle ranges from about 1 degree to about 2 degrees.

8. The process chamber of claim 6, wherein the magnetron further comprises a second motor coupled to the shaft configured to rotate the magnetron about the axis of rotation and move the magnetron in a direction parallel to the axis of rotation and a plurality of magnets coupled to the backing plate and arranged linearly.

9. A process chamber for use with a sputtering target, the process chamber comprising:
a chamber body;
a substrate support disposed in the chamber body; and
a magnetron disposed over the sputtering target when the sputtering target is installed in the process chamber over the substrate support, the magnetron comprising:
a shaft defining an axis of rotation and a plurality of magnets having ends facing the sputtering target that define a plane that is operable to be tilted at an adjustable angle with respect to a surface of the sputtering target facing the substrate support, the magnetron moveable about the axis of rotation, in a direction parallel to the axis of rotation, and at an angle with respect to the surface of the sputtering target; and
a motor coupled to the shaft configured to adjust the angle of the magnetron with respect to the surface of the sputtering target.

10. The process chamber of claim 9, wherein the magnetron further comprises a second motor coupled to the shaft configured to rotate the magnetron about the axis of rotation and move the magnetron in a direction parallel to the axis of rotation, a backing plate, and the plurality of magnets are coupled to the backing plate.

11. The process chamber of claim 10, wherein the magnetron further comprises a connector disposed over the backing plate.

12. The process chamber of claim 11, wherein the backing plate has a longitudinal dimension, and the connector is positioned on the backing plate so the backing plate is substantially symmetric with respect to the connector in the longitudinal dimension.

13. The process chamber of claim 11, wherein the magnetron is disposed inside a magnetron cavity defined by a coolant chamber.

14. The process chamber of claim 13, wherein the shaft is disposed through the coolant chamber and a rotary seal disposed through a wall of the coolant chamber.

15. The process chamber of claim 13, wherein the connector is disposed on the backing plate such that the backing plate is substantially symmetric with respect to the connector and the plurality of magnets are arranged in concentric circles.

16. The process chamber of claim 1, wherein the adjustable angle has range between about 0.3 degrees and about 5 degrees.

* * * * *